United States Patent
Nakada et al.

(10) Patent No.: US 7,388,215 B2
(45) Date of Patent: Jun. 17, 2008

(54) PATTERN DRAWING METHOD, STAMPER MANUFACTURING METHOD, AND PATTERN DRAWING APPARATUS

(75) Inventors: Katsuyuki Nakada, Tokyo (JP); Kazuhiro Hattori, Tokyo (JP); Shuichi Okawa, Tokyo (JP)

(73) Assignee: TDK Corporation, Tokyo (JP)

( * ) Notice: Subject to any disclaimer, the term of this patent is extended or adjusted under 35 U.S.C. 154(b) by 160 days.

(21) Appl. No.: 11/457,545

(22) Filed: Jul. 14, 2006

(65) Prior Publication Data

US 2007/0023704 A1    Feb. 1, 2007

(30) Foreign Application Priority Data

Jul. 26, 2005  (JP)  ............................. 2005/215511

(51) Int. Cl.
*G21K 5/10* (2006.01)
*H01J 37/30* (2006.01)

(52) U.S. Cl. .............................. 250/492.22; 250/492.2; 250/492.3; 250/492.23; 369/44.24

(58) Field of Classification Search ........... 250/492.22, 250/492.2, 492.3, 492.23; 369/44.24
See application file for complete search history.

(56) References Cited

U.S. PATENT DOCUMENTS 6,442,110 B1 *   8/2002   Yamamoto et al. ...... 369/44.23
6,921,499 B2     7/2005   Komatsu et al.
2005/0011767 A1  1/2005   Nakada et al.
2005/0151284 A1* 7/2005   Soeno ........................ 264/1.33
2005/0263915 A1  12/2005  Fujita et al.
2005/0285308 A1  12/2005  Hattori et al.

FOREIGN PATENT DOCUMENTS

JP        2003-091806        3/2003

OTHER PUBLICATIONS

U.S. Appl. No. 10/565,125, to Takai et al., filed Jan. 19, 2006.
U.S. Appl. No. 11/536,954, to Hattori et al., filed Sep. 29, 2006.
U.S. Appl. No. 11/536,846, to Hattori et al., filed Sep. 29, 2006.
English language Abstract of JP 2003-091806.

* cited by examiner

*Primary Examiner*—Nikita Wells
(74) *Attorney, Agent, or Firm*—Greenblum & Bernstein, P.L.C.

(57) ABSTRACT

A pattern drawing method capable of drawing a pattern such that opposite ends of a formation region on an inner periphery side and an outer periphery side are substantially linearly formed. A drawing beam is intermittently irradiated N times onto a generally belt-shaped exposure area extending in a direction of rotation of the substrate from one end to the other end of the belt-shaped exposure area in the direction of rotation of the substrate, the belt-shaped exposure area being defined within a formation region, in which one of the convex or concave portions is to be formed, to thereby irradiate the drawing beam onto N generally belt-shaped irradiation areas extending in the direction of rotation of the substrate.

6 Claims, 6 Drawing Sheets

PATTERN DRAWING METHOD, STAMPER MANUFACTURING METHOD, AND PATTERN DRAWING APPARATUS

BACKGROUND OF THE INVENTION

1. Field of the Invention

The present invention relates to a pattern drawing method and a pattern drawing apparatus, for drawing a planar pattern of one of convex or concave portions in a concave/convex pattern for use in manufacturing e.g., an information recording medium, and a stamper manufacturing method using the drawn planar pattern.

2. Description of the Related Art

As this kind of the pattern drawing method, there has been proposed a method of manufacturing a master carrier (master carrier for magnetic transfer) for magnetically transferring a servo pattern or the like to a slave medium in Japanese Laid-Open Patent Publication (Kokai) No. 2003-91806. In this method, when a master carrier is manufactured, first, a drawing process e.g., of a servo pattern is executed. More specifically, a photoresist is spin-coated on a circular plate, such as a glass, to form a photoresist layer (hereinafter also referred to as "the resist layer"). Then, the resist layer is irradiated with an electron beam to thereby draw a servo pattern, for example. In doing this, according to the method, the servo pattern or the like is formed by irradiating the resist layer with an electron beam having an effective drawing diameter smaller than the width of a track, while rotating the circular plate, and thereby dividing a region within which a convex portion of the master carrier, for example, is to be formed (hereinafter referred to as "the formation region") into a plurality of belt-shaped areas (hereinafter referred to as "the belt-shaped areas") in the direction of radius of the circular plate.

More specifically, as shown in FIG. 12, the circular plate is rotated in a direction indicated by an arrow R, and when a start position S1 at which irradiation of the electron beam is to be started is positioned under an electron gun, the electron gun is caused to start the irradiation of the electron beam. Then, when a stop position E1 at which irradiation of the electron beam is to be stopped is positioned under the electron gun, the electron gun is caused to stop the irradiation of the electron beam. This completes the irradiation of the electron beam onto a belt-shaped irradiation area A11 indicated by a broken line in FIG. 12. Next, the electron gun is adjusted such that the irradiation position of the electron beam on the circular plate (central position of the irradiated electron beam) is outward of e.g., the belt-shaped irradiation area A11 (rightward of the same as viewed in FIG. 12). Then, when a start position S2 is positioned under the electron gun, irradiation of the electron beam is started, and when a stop position E2 is positioned under the electron gun, the irradiation of the electron beam is stopped. This completes the irradiation of the electron beam onto a belt-shaped irradiation area A12 indicated by a broken line in FIG. 12. Similarly, the electron beam is irradiated onto a belt-shaped irradiation area A13 from a start position S3 to a stop position E3, Then, the circular plate on which the drawing process is completed is subjected to a development process to thereby form a concave portion (concave/convex pattern) on the resist layer. In this case, e.g., a portion P11 and a portion P12 of the resist layer are irradiated with the electron beam only for a very short time period after the start of irradiation of the electron beam or before the stop of irradiation thereof, and the amount of the electron beam exposure of the portions is small, so that they remain on the disk without being eliminated by the development process. On the other hand, e.g., portions P13 to P15 of the resist layer are eliminated from the circular plate by the development process, since they continue to be irradiated for a longer time period with a sufficient amount of the electron beam exposure. As a result, the resist layer within a formation region A0x indicated by a one-dot chain line in FIG. 12 is eliminated to form a concave portion. Thus a concave/convex pattern is formed on the circular plate. Subsequently, a conductive layer is formed on a surface in which the concave/convex pattern is formed, whereafter an electroforming process is carried out to manufacture a metal substrate. In doing this, the concave/convex pattern formed on the circular plate (resist layer) by the development process is transferred to a metal material to thereby form a convex portion having approximately the same shape in plan view as that of the formation region A0x. After that, a magnetic layer is formed in a manner so as to cover the concave/convex pattern transferred to the substrate, whereby the master carrier is completed.

SUMMARY OF THE INVENTION

As a result of the study of the conventional manufacturing method, however, the present inventors found the following problems. In the conventional manufacturing method, in the drawing process of the servo pattern and the like, to cause exposure of the whole area of the formation region A0x within which the convex portion of the master carrier is to be formed to the electron beam, the electron beam continues to be irradiated between the start position S and the stop position E whereby the electron beam is irradiated onto the belt-shaped irradiation areas A11 to A13 elongated in the direction of rotation of the circular plate. In this case, as described above, e.g., the portion P12 of the resist layer is irradiated with the electron beam for a short time period (the amount of irradiation is small) and hence the portion P12 remains on the circular plate without being eliminated by the development process. In contrast, the portion P15 is irradiated with the electron beam when the center of irradiation of the electron beam is e.g., at a position B1, a position B2, and a position B3, so that the photoresist of the portion P15 is exposed to a sufficient amount of the electron beam and hence is eliminated from the circular plate by the development process. As a result, on the inner periphery side (left side as viewed in FIG. 12) of the formation region A0x within which a convex portion of the master carrier is to be formed, the formation region A0x is rounded such that an intermediate portion between the start position S1 and the stop position E1 bulges toward the inner periphery side. Similarly, also on the outer periphery side of the formation region A0x, the formation region A0x is rounded such that an intermediate portion between the start position S3 and the stop position E3 bulges toward the outer periphery side.

In the above case, a burst pattern of the servo pattern, for example, is configured to have a plurality of rectangular areas (rectangular areas magnetized by the master carrier, for example) arranged along the direction of rotation of the slave medium so as to detect the radial position of the magnetic head. On the other hand, in the master carrier manufactured by the conventional method, as described above, the formation region A0x after the development process is rounded on the inner periphery side and the outer periphery side thereof, due to the difference in the amount of irradiation of the electron beam during the drawing process of the servo pattern, which causes the rectangular region of the master carrier to be rounded on the inner periphery side and the outer periphery side thereof, similarly to the formation region A0x. Therefore, in the slave medium (having e.g., the servo pattern magnetically transferred thereto) manufactured by the master carrier manufactured according to the conventional method, each rectangular region (hereinafter referred to as "the unit burst region") for forming the burst pattern is rounded on the inner periphery side and the outer periphery side thereof. This causes degradation of the quality of a burst signal (position error signal).

The present invention was made to solve the problems described above, and a main object of the present invention is to provide a pattern drawing method and a pattern drawing apparatus, which are capable of drawing a pattern such that opposite ends of a formation region on an inner periphery side and an outer periphery side of the formation region are substantially linearly formed, and a method of manufacturing a stamper, which is capable of manufacturing a stamper that has a concave/convex pattern formed of convex or concave portions whose opposite ends on an inner periphery side and an outer periphery side are substantially linear.

To attain the above object, in a first aspect of the present invention, there is provided a pattern drawing method of drawing a planar pattern of one of convex or concave portions forming a concave/convex pattern on a resin layer while rotating a substrate on whose surface the resin layer is formed, the method comprising intermittently irradiating a drawing beam N times (N is a natural number equal to or more than 2) onto a generally belt-shaped exposure area extending in a direction of rotation of the substrate from one end to the other end of the belt-shaped exposure area in the direction of rotation of the substrate, the belt-shaped exposure area being defined within a formation region, in which one of the convex or concave portions is to be formed, thereby irradiating the drawing beam onto N generally belt-shaped irradiation areas extending in the direction of rotation of the substrate. It should be noted that throughout the present specification and claims, the term "belt-shaped exposure area" is intended to mean a belt-shaped area that matches either an area which is eliminated from the substrate by a development process performed after completion of drawing the planar pattern (when the resin layer is formed e.g., of a positive-type resist), or an area which remains on the substrate by the development process (when the resin layer is formed e.g., of a negative-type resist). In short, the term means a belt-shaped area that is exposed to the drawing beam by irradiation of the drawing beam onto the belt-shaped irradiation areas, to such an extent that the belt-shaped area is eliminated or remains during the development process.

To attain the above object, in a second aspect of the present invention, there is provided a pattern drawing apparatus configured to draw a planar pattern of one of convex or concave portions forming a concave/convex pattern on a resin layer while rotating the substrate on whose surface the resin layer is formed, the pattern drawing apparatus comprising a rotating mechanism configured to rotate the substrate on whose surface the resin layer is formed, a beam irradiating section configured to irradiate a drawing beam, and a control section configured to control rotation of the substrate rotated by the rotating mechanism and to control start and stop of irradiation of the drawing beam irradiated by the beam irradiating section, wherein the control section controls the beam irradiating section to intermittently irradiate the drawing beam N times (N is a natural number equal to or more than 2) onto a generally belt-shaped exposure area extending in the direction of rotation of the substrate from one end to the other end of the belt-shaped exposure area in a direction of rotation of the substrate, the belt-shaped exposure area being defined within a formation region, in which one of the convex or concave portions is to be formed, to thereby irradiate the drawing beam onto N generally belt-shaped irradiation areas extending in the direction of rotation of the substrate.

According to the pattern drawing method and the pattern drawing apparatus of the present invention, the drawing beam is intermittently irradiated N times onto the belt-shaped exposure area extending in the direction of rotation of the substrate from one end to the other end thereof in the direction of rotation of the substrate, the belt-shaped exposure area being defined in the formation region, in which one of the convex or concave portions is to be formed, to thereby irradiate the drawing beam onto the N belt-shaped irradiation areas extending in the direction of rotation of the substrate. This makes it possible to avoid an excessive amount of the electron beam being irradiated to the periphery of the intermediate portion of the belt-shaped exposure area in the direction of rotation of the substrate (the resin layer from being exposed to an excessive amount of the electron beam). As a result, the respective opposite ends of the formation region (belt-shaped exposure area) on the inner periphery side and the outer periphery side thereof can be substantially linearly formed, and therefore by drawing e.g., each of unit burst regions (rectangular regions) forming a burst pattern according to the drawing method, it is possible to form a concave/convex pattern that makes it possible to form a burst pattern enabling detection of the position of a magnetic head with high accuracy.

The drawing beam may be intermittently irradiated N times onto at least respective generally belt-shaped exposure areas on an innermost periphery side and an outermost periphery side of the formation region, from the one end to the other end of each of the belt-shaped exposure areas, the one formation region comprising a plurality of the belt-shaped exposure areas located at different distances from a center of the substrate.

With the above configuration, in the respective belt-shaped exposure areas at least on the innermost periphery side and on the outermost periphery side of the one formation region comprising the plurality of the belt-shaped exposure areas, the drawing beam is intermittently irradiated N times onto each of the belt-shaped exposure areas from the one end to the other end thereof in the direction of rotation of the substance, whereby even if the drawing beam is continuously irradiated onto the belt-shaped exposure areas except for the respective belt-shaped exposure areas on the innermost periphery side and the outermost periphery side of the formation region, from one end to the other end of each of the belt-shaped exposure areas in the direction of rotation of the substrate, it is possible to reliably substantially linearly form the opposite ends of the formation region on the inner periphery side and the outer periphery side thereof.

The drawing beam may be continuously irradiated onto at least one of the belt-shaped exposure areas except for the respective belt-shaped exposure areas on the innermost periphery side and the outermost periphery side of the formation region, from the one end to the other end of the at least one of the belt-shaped exposure areas.

With the above configuration, compared with a drawing method in which all the belt-shaped exposure areas from the innermost periphery side to the outermost periphery side of the formation region are exposed to the drawing beam through intermittent drawing beam irradiation, it is possible to reduce the number of times of control of the start and stop of the drawing beam irradiation by the number of the belt-shaped exposure areas continuously irradiated from one ends to the other ends thereof in the direction of rotation. Therefore, it is possible to reduce the amount of information on the start positions and the stop positions in drawing procedure data indicating drawing procedures of a pattern. This makes it possible to easily draw a pattern which has a formation region with opposite ends on an inner periphery side and an outer periphery side thereof being substantially linear, while preventing control of the beam irradiating section by the control section of the pattern drawing apparatus from being made complicated.

The drawing beam may be irradiated onto one of the belt-shaped irradiation areas adjacent to each other in the direction of rotation of the substrate in one of the belt-shaped exposure areas during M-th (M is a natural number) rotation of the substrate, whereafter the drawing beam is irradiated onto the other of the belt-shaped irradiation areas adjacent to each other during L-th (L is a natural number equal to or more than (M+1)) rotation of the substrate.

With the above configuration, there is given a certain time period from time that the drawing beam ceases to be irradiated onto one belt-shaped irradiation area to time that the drawing beam starts to be irradiated onto the other belt-shaped irradiation area. Therefore, even if the rotational speed of the substrate is sufficiently increased, it is possible to irradiate the drawing beam and stop the irradiation of the beam onto the respective belt-shaped irradiation areas at an accurate timing. This makes it possible to sufficiently shorten a time period required for the drawing process per one substrate. Further, also when a pattern drawing apparatus incorporating an inexpensive blanking control section with low processing capability is used, it is possible to irradiate the drawing beam at an accurate timing without largely decreasing the rotational speed of the substrate.

To attain the above object, in a third aspect of the present invention, there is provided a method of manufacturing a stamper, the method comprising forming the concave/convex pattern by performing a development process on the resin layer having the planar pattern drawn thereon according to any one of the above described methods, and transferring the concave/convex pattern to a stamper-forming member according to a predetermined procedure.

According to this stamper manufacturing method, it is possible to easily manufacture an information recording medium having a concave/convex pattern, which includes rectangular regions (convex portions having a rectangular shape in plan view, or concave portions having a rectangular shape in plan view), such as the unit burst regions of the burst pattern, with respective opposite ends on the inner periphery side and the outer periphery side thereof being substantially linear.

It should be noted that the present disclosure relates to the subject matter included in Japanese Patent Application No. 2005-215511 filed Jul. 26, 2005, and it is apparent that all the disclosures therein are incorporated herein by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENT

Figure 1:
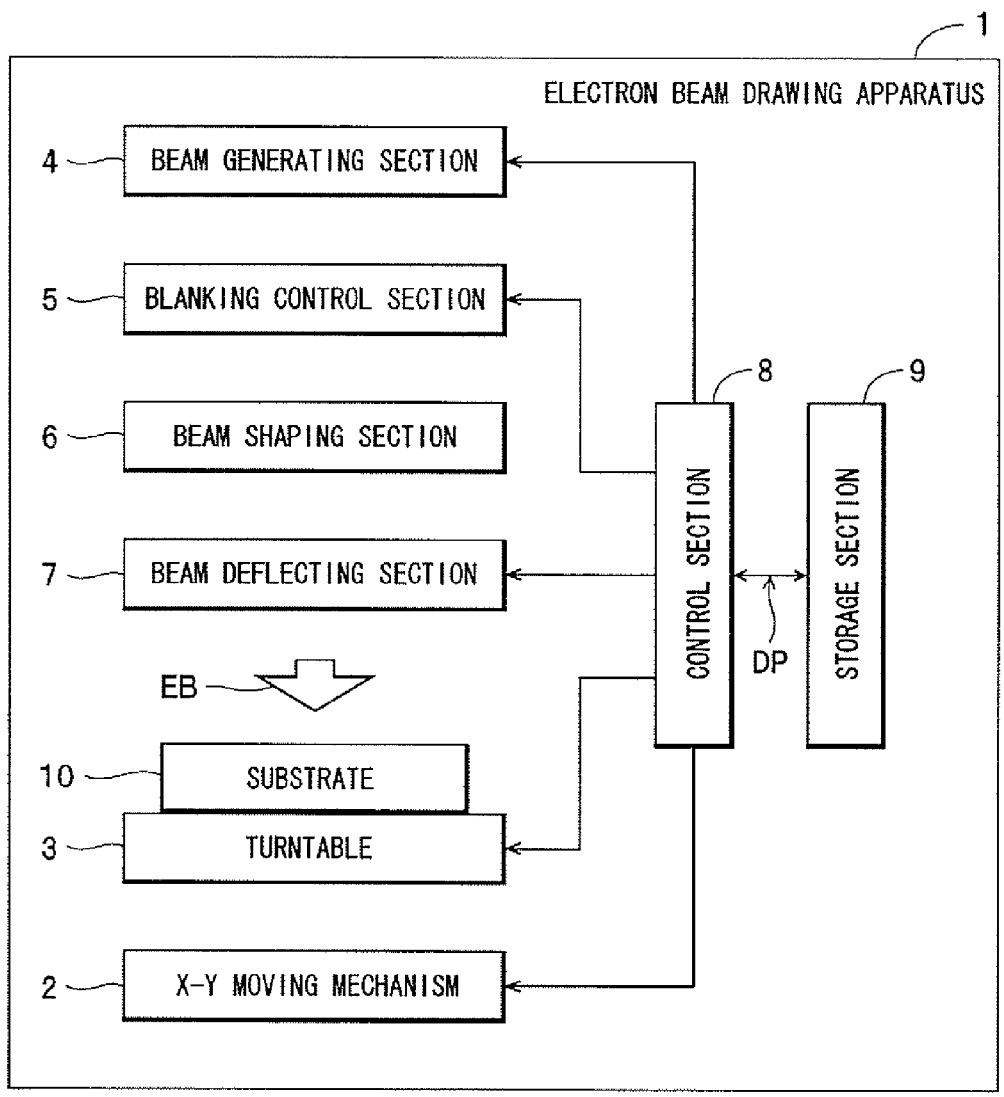
FIG. 1 is a block diagram showing the configuration of an electron beam drawing apparatus.

The invention will now be described in detail with reference to the accompanying drawings with respect to a pattern drawing method, a stamper manufacturing method, and a pattern drawing apparatus, according to the preferred embodiment of the present invention.

First, a description will be given of the configuration of an electron beam drawing apparatus 1 for drawing a pattern according to the drawing method of the present invention.

Figure 2:
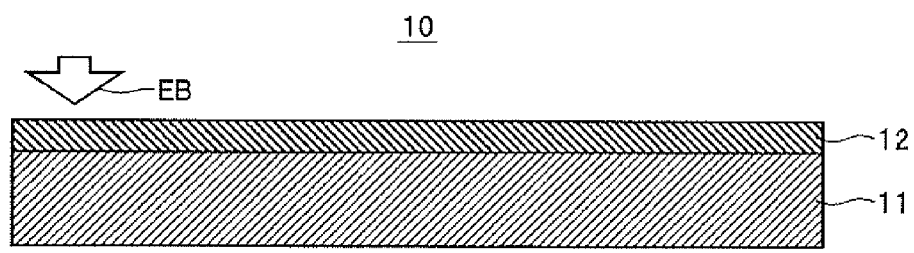
FIG. 2 is a cross-sectional view of a substrate.
Figure 3:
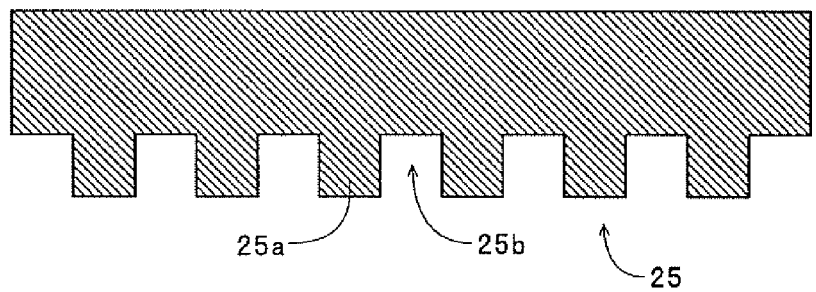
FIG. 3 is a cross-sectional view of a stamper.

As shown in FIG. 1, the electron beam drawing apparatus (hereinafter also referred to as the "drawing apparatus") 1 corresponds to the pattern drawing apparatus according to the present invention. The drawing apparatus 1 includes an X-Y moving mechanism 2, a turntable 3, a beam generating section 4, a blanking control section 5, a beam shaping section 6, a beam deflecting section 7, a control section 8, and a storage section 9, and is configured to be capable of emitting an electron beam EB (an example of a drawing beam in the present invention) from the beam generating section 4 to thereby draw an exposure pattern, not shown, for manufacturing information recording media, on a substrate 10. In this case, the substrate 10 is a forming board for manufacturing a stamper 20 (see FIG. 3), and as shown in FIG. 2, has a resin layer 12 formed on a surface of a circular plate-shaped silicon substrate 11 (substrate in the present invention) thereof (e.g., a resist layer formed by coating a surface of the silicon substrate 11 with an electron beam-sensitive positive-type resist). Further, the stamper 20 manufactured using the substrate 10 is a master disk for manufacturing a magnetic disk 30 shown in FIGS. 4 and 5. As described hereinafter, a concave/convex pattern 25 having convex portions 25a and concave portions 25b, as shown in FIG. 3, is formed on the stamper by transferring a concave/convex pattern formed by developing an exposure pattern drawn on the resin layer 12 using the drawing apparatus 1.

Figure 4:
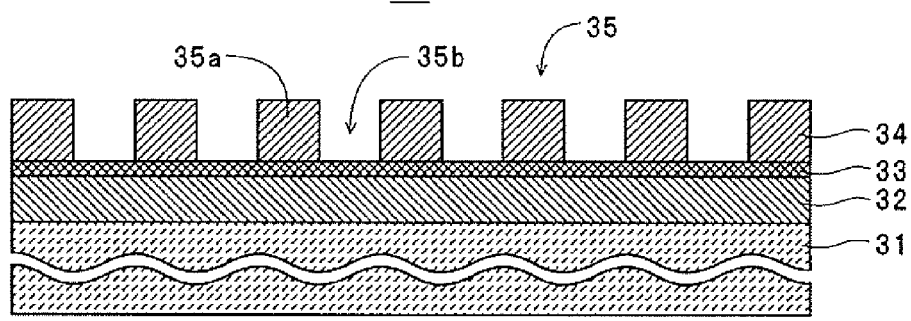
FIG. 4 is a cross-sectional view of a magnetic disk.
Figure 5:
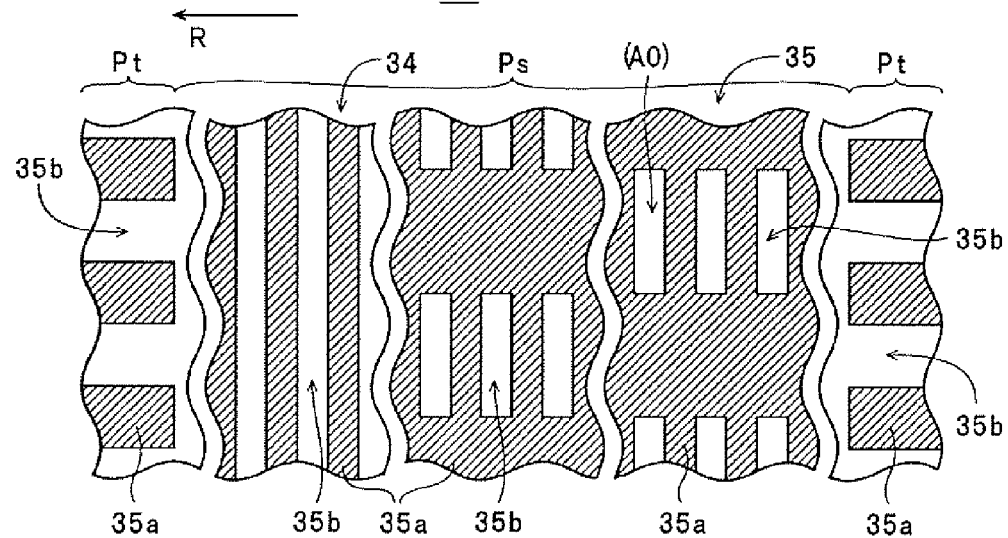
FIG. 5 is a plan view of the magnetic disk shown in FIG. 4.

Further, the magnetic disk 30 manufactured using the stamper 20 is a discrete track-type information recording medium (patterned medium), and accommodated within a housing, not shown, together with a motor configured to rotate the magnetic disk 30, and a recording and reproducing head (flying-type head slider on which a recording head and a reproducing head are formed) configured to record and reproduce recording data on and from the magnetic disk 30 to form a magnetic recording device (hard disk drive). As shown in FIG. 4, the magnetic disk 30 has a soft magnetic layer 32, an intermediate layer 33, and a magnetic layer 34 sequentially formed on a substrate 31 in the mentioned order, and as shown in FIG. 5, is configured such that a data truck pattern Pt and a servo pattern Ps (concave/convex pattern 35) comprise convex portions 35a and concave portions 35b formed in the magnetic layer 34, whereby the magnetic disk 30 is capable of recording data in a perpendicular recording method. In this case, in the magnetic disk 30, the convex portions 35a are formed corresponding to the respective concave portions 25b of the concave/convex pattern 25 of the stamper 20, and the concave portions 35b are formed corresponding to the respective convex portions 25a of the concave/convex pattern 25. Further, in the magnetic disk 30, a plurality of the concave portions 35b having a rectangular shape in plan view are formed so as to be disposed along the direction of rotation of the substrate (direction indicated by an arrow R in FIG. 5), whereby a burst pattern of the servo pattern Ps is formed.

The X-Y moving mechanism 2 moves the turntable 3 along a plane of rotation of the substrate 10 rotated by the turntable 3, under the control of the control section S. The turntable 3 corresponds to a rotating mechanism in the present invention, is configured to be capable of having the substrate 10 placed thereon, and rotates the substrate 10 under the control of the control section 8. The beam generating section 4 forms a beam irradiating section of the present invention together with the blanking control section 5, and generates and emits the electron beam ES for drawing an exposure pattern (planar pattern in the present invention) onto the resin layer 12 of the substrate 10. The blanking control section 5 performs ON-OFF control of the emission of the electron beam EB emitted by the beam generating section 4, under the control of the control section 8. The beam shaping section 6 is comprised of a beam shaping lens, and an aperture, not shown, and shapes (reduces the diameter of) the electron beam ESB emitted by the beam generating section 4. In this case, the drawing apparatus 1 irradiates the electron beam EB having an effective drawing diameter sufficiently smaller than the width of a concave portion between data recording tracks (the concave portion 35b between the convex portions 35a of the data truck pattern Pt), whereby as described hereinafter, the drawing apparatus 1 irradiates the electron beam EB a plurality of times in the direction of the radius of the substrate 10 such that the whole area of each formation region where a concave portion corresponding to the concave portion 35b of the magnetic disk 30 is to be formed (an example in which one of the convex or concave portions to be formed is a concave portion) is exposed to the electron beam EB. It should be noted that when the resin layer 12 of the substrate 10 is formed of an electron beam-sensitive negative-type resist, the drawing apparatus 1 irradiates the electron beam EB a plurality of times in the direction of the radius of the substrate 10 such that the whole area of each formation region where a convex portion corresponding to the convex portion 35a of the magnetic disk 30 is to be formed (an example in which one of the convex or concave portions to be formed is a convex portion) is exposed to the electron beam EB.

The beam deflecting section 7 deflects the electron beam EB shaped by the beam shaping section 6, under the control of the control section 8, thereby changing an irradiation position of the electron beam EB on the resin layer 12. The control section 8 controls the X-Y moving mechanism 2 to move the substrate 10 together with the turntable 3, and controls the turntable 3 to rotate the substrate 10. Further, the control section 8 controls the beam generating section 4, the blanking control section 5, and the beam deflecting section 7, to thereby emit the electron beam EB to a predetermined position on the resin layer 12 of the substrate 10 being rotated by the turntable 3. The storage section 9 stores drawing procedure data DP which can specify a drawing procedure of the exposure pattern to be drawn on the substrate 10. In this case, the drawing procedure data DP is configured to include data which can specify timing for causing the blanking control section 5 to start and stop emitting the electron beam EB.

Next, a method of manufacturing the stamper 20 will be described with reference to drawings.

First, a resist (positive-type resist) for electron beam lithography is spin-coated on a surface of the silicon substrate 11 such that the resist has a thickness of approximately 100 nm after it is subjected to a baking process, whereby the resin layer (resist layer) 12 is formed on the silicon substrate 11. Then, the baking process is performed on the coated resin layer 12. Thus, the substrate 10 shown in FIG. 2 is completed. Subsequently, the substrate 10 is placed on the turntable 3 of the drawing apparatus 1 with the resin layer 12 facing upward, and planar patterns (planar patterns of the data track pattern Pt and the servo pattern Ps: exposure pattern) of the respective convex portions 25a of the concave/convex pattern on the stamper 20 are drawn on the resin layer 12 of the substrate 10. More specifically, when the start of drawing is instructed by an operator, the control section 8 controls the X-Y moving mechanism 2 to move the turntable 3, thereby positioning an innermost peripheral portion of an annular area where the planar pattern is to be drawn, under the beam generating section 4. Then, the control section 8 controls the turntable 3 to rotate the substrate 10 and at the same time controls the beam generating section 4, the blanking control section 5, and the beam deflecting section 7 to emit the electron beam EB to the substrate 10 (resin layer 12) on the turntable 3, according to the drawing procedure data DP stored in the storage section 9.

Figure 6:
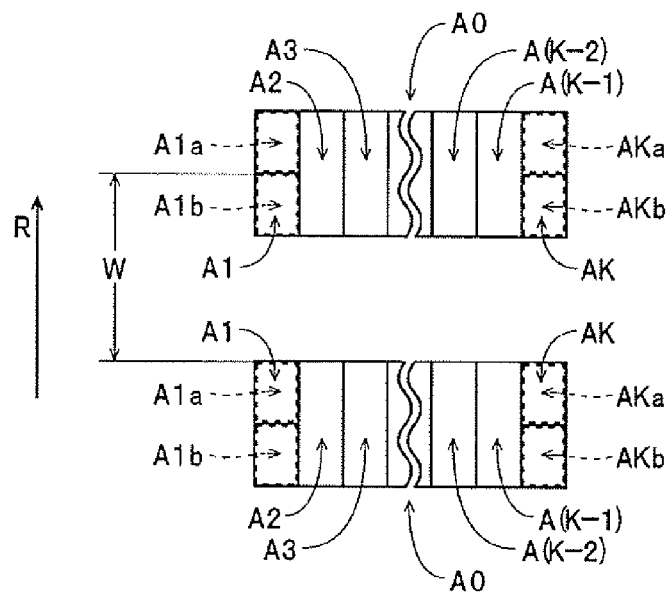
FIG. 6 is a diagram useful in explaining a procedure for drawing a burst pattern or the like on the substrate.

In doing this, while rotating the substrate 10, the control section 8 causes the electron beam EB to be emitted to the substrate 10 such that a plurality of belt-shaped exposure areas elongated in the direction of rotation of the substrate 10 are sequentially exposed to the electron beam EB to thereby expose all the areas of formation regions, where the convex portions 25a of the concave/convex pattern 25 on the stamper 20 are to be formed, to the electron beam EB. More specifically, as shown in FIG. 6, the control section 8 causes the electron beam EB to be emitted to the substrate 10 such that in a formation region A0 (an example of the formation region in which the convex portions 25a of the stamper 20 are to be formed) corresponding e.g., to a unit burst region (rectangular concave portion 35b of the burst pattern shown in FIG. 5) forming the burst pattern of the servo pattern Ps, K (K is a natural number equal to or more than 2) belt-shaped exposure areas A1 to AK located at different distances from the center of the substrate 10 are sequentially exposed to the electron beam EB, whereby the whole area of the formation region A0 is exposed to the electron beam EB. Further, when the control section 8 causes the electron beam EB to be emitted to each of the belt-shaped exposure area A1 on the innermost periphery side and the belt-shaped exposure area AK on the outermost periphery side, out of a plurality of belt-shaped exposure areas A1 to AK forming the one formation region A0, the control section 8 causes the electron beam EB to be sequentially emitted e.g., to two belt-shaped irradiation areas disposed in the direction of rotation of the substrate 10 (an example in which N in the present invention is 2).

For example, as to the belt-shaped exposure area A1 on the innermost periphery side in the formation region A0, to expose the whole area of the belt-shaped exposure area A1 to the electron beam EB, the electron beam EB is intermittently irradiated twice between one end and the other end of the belt-shaped exposure area A1 in the direction of rotation such that the electron beam EB is sequentially emitted to two belt-shaped irradiation areas A1a and A1b disposed in the direction of rotation (adjacent to each other in the direction of rotation). In doing this, the control section 8 stops irradiation of the electron beam EB at a central portion of the belt-shaped exposure area A1 in the direction of rotation of the area A1 whereby the exposure is performed dividing the belt-shaped exposure area A1 into two at the central portion in the direction of rotation. Further, when the electron beam EB is irradiated to the belt-shaped exposure area AK on the outermost periphery side in the formation region A0, to expose the whole area of the belt-shaped exposure area AK to the electron beam EB, the electron beam ES is intermittently irradiated twice between one end and the other end of the belt-shaped exposure area AK in the direction of rotation such that the electron beam EB is sequentially emitted to two belt-shaped irradiation areas AKa and AKb disposed in the direction of rotation. In doing this, the control section 8 stops the irradiation of the electron beam EB at a central portion of the belt-shaped exposure area AK in the direction of rotation whereby the exposure is performed dividing the belt-shaped exposure area AK into two at the central portion in the direction of rotation.

Figure 7:
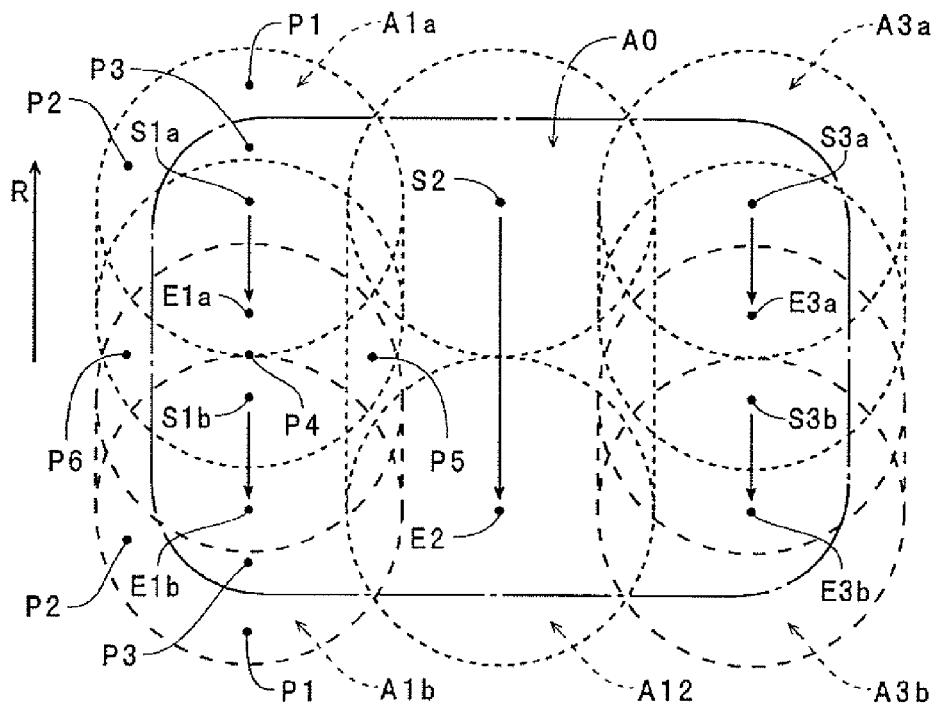
FIG. 7 is a diagram useful in explaining a procedure for irradiating an electron beam onto a formation region.

More specifically, as shown in FIG. 7, the control section 8 controls the turntable 3 to rotate the substrate 10 in the direction indicated by an arrow R under the condition of constant linear velocity, and waits for a time to come when irradiation of the electron beam EB onto the formation region A0 is to be started. Further, when a start position S1a at which the irradiation of the electron beam EB is to be started is positioned under the bean generating section 4 in accordance with rotation of the substrate 10, the control section 8 controls the blanking control section 5 to start the irradiation of the electron beam EB. Then, when a stop position Ela at which the irradiation of the electron beam EB is to be stopped is positioned under the beam generating section 4 in accordance with rotation of the substrate 10, the control section 8 controls the blanking control section 5 to stop the irradiation of the electron beam EB. Thus, the irradiation of the electron beam EB onto the belt-shaped irradiation area A1a indicated by broken lines in FIG. 7 is completed.

Subsequently, when a start position S1b at which the irradiation of the electron beam EB is to be started is positioned under the beam generating section 4 in accordance with rotation of the substrate 10, the control section 8 controls the blanking control section 5 to start the irradiation of the electron beam EB. Then, when a stop position E1b at which the irradiation of the electron beam EB is to be stopped is positioned under the beam generating section 4, the control section 8 controls the blanking control section 5 to stop the irradiation of the electron beam EB. This completes the irradiation of the electron beam EB onto the belt-shaped irradiation area A1b indicated by broken lines in FIG. 7, to complete the intermittent irradiation of the electron beam EB onto the belt-shaped exposure area A1. It should be noted that for ease of understanding the present invention, an example is illustrated in FIG. 7 in which only three belt-shaped exposure areas exist (an example where K=3) in the formation region A0.

On the other hand, in the drawing apparatus 1, each of the belt-shaped exposure areas A2 to A(K−1) except for the belt-shaped exposure area A1 on the innermost periphery side and the belt-shaped exposure area AK on the outermost periphery side is continuously irradiated with the electron beam EB between one end and the other end of the belt-shaped exposure area in the direction of rotation. More specifically, during the second rotation of the substrate 10, the control section 8 controls the beam deflecting section 7 to shift the irradiation position of the electron beam EB toward the outer periphery of the substrate 10 (toward the right side as viewed in FIG. 7), and when a start position S2 at which irradiation of the electron beam EB is to be started is positioned under the beam generating section 4, the control section 8 controls the blanking control section 5 to start the irradiation of the electron beam EB. Then, when a stop position E2 at which the irradiation of the electron beam ES is to be stopped is positioned under the beam generating section 4 in accordance with rotation of the substrate 10, the control section 8 controls the blanking control section 5 to stop the irradiation of the electron beam EB. This completes the irradiation of the electron beam EB onto a belt-shaped irradiation area A12 indicated by broken lines in FIG. 7. Subsequently, during the third rotation of the substrate 10, the control section 8 controls the beam deflecting section 7 to shift the irradiation position of the electron beam EB toward a further outer periphery of the substrate 10 and similarly to the above-described irradiation of the electron beam ES onto the belt-shaped exposure area A1, causes the electron beam EB to be intermittently irradiated twice onto the belt-shaped exposure area A3. This completes the irradiation of the electron beam EB onto belt-shaped irradiation areas A3a and A3b to complete drawing (exposure to the electron beam EB) of the formation region A0 corresponding to the unit burst region for forming the burst pattern on the innermost periphery side.

In this case, in the illustrated example, the electron beam ER is irradiated onto the belt-shaped irradiation areas A1a, A1b, A12, AKa, and AKb in the mentioned order, whereby the whole area of one formation region A0 is exposed to the electron beam EB. As described above, while the turntable 3 is controlled to rotate the substrate 10, according to the drawing procedure data DP, the blanking control section 5 is controlled for blanking control of emission of the electron beam EB, and the beam deflecting section 7 and the X-Y moving mechanism 2 are controlled to adjust the irradiation positions of the electron beam EB onto the substrate 10 as required, whereby the electron beam EB is sequentially irradiated onto the substrate 10 up to the outermost peripheral area thereof to thereby form a latent image in each formation region A0. This completes the drawing process of the planar patterns (drawing patterns) of the servo pattern Ps and the data track pattern Pt. Further, although actually, it is necessary to adjust the start positions S1a, S1b, S2, S3a, and S3b, and the stop positions E1a, E1b, E2, E3a, and E3b according to skew angles to be given to the servo pattern Ps and the like as required, description and illustration of the skew angles are omitted for ease of understanding the present invention.

Next, the resin layer 12 having the planar patterns drawn thereon is subjected to a development process. In this case, as shown in FIG. 7, e.g., portions P1 and P2 of the resin layer 12 remain on the silicon substrate 11 without being eliminated by the development process, since they are irradiated with the electron beam EB only for a very short time period after the start of irradiation of the electron beam EB or before the stop of irradiation thereof, and therefore the amount of the electron beam EB exposure of the portions is small. On the other hand, e.g., a portion P3 of the resin layer 12 is eliminated from the silicon substrate 11 by the development process, since the portion P3 continues to be irradiated with the electron beam EB and the amount of electron beam exposure thereof is sufficient, as the center of the electron beam EB moves from the start position S1a to a position near the stop position E1a. Further, e.g., an amount of exposure of a portion P4 of the resin layer 12 is small when the irradiation of the electron beam EB onto the belt-shaped irradiation area A1a is completed, but after that, the state of exposure of the portion P4 becomes sufficient during irradiation of the electron beam EB onto the belt-shaped irradiation area A1b. Furthermore, e.g., an amount of exposure of a portion P5 of the resin layer 12 is small when the irradiation of the electron beam EB onto the belt-shaped exposure area A1 (belt-shaped irradiation areas A1a and A1b) is completed, but the state of exposure of the position P5 becomes sufficient during irradiation of the electron beam EB onto a belt-shaped exposure area A2 (belt-shaped irradiation area A12) outward of the belt-shaped exposure area A1. Therefore, the portions P4 and P5 of the resin layer are eliminated from the silicon substrate 11 by the development process, similarly to the portion P3 of the resin layer.

Further, as described above, in the drawing apparatus 1, so as to expose the whole area of the belt-shaped exposure area A1 on the innermost periphery side in the formation region A0 to the electron beam EB, the electron beam EB is intermittently irradiated onto the belt-shaped exposure area A1 from one end to the other thereof in the direction of rotation of the area A1, whereby the electron beam EB is sequentially irradiated to two belt-shaped irradiation areas A1a and A1b disposed in the direction of rotation of the substrate 10. Therefore, e.g., a portion P6 of the resin layer 12 is not irradiated with the electron beam EB from time that the irradiation of the electron beam ED onto the belt-shaped irradiation area A1a is stopped (from the state where the stop position E1a is positioned under the beam generating section 4) to time that the irradiation of the electron beam EB onto the belt-shaped irradiation area A1b is started (till the start position S1b is positioned under the beam generating section 4). As a result, the amount of exposure of portion P6 is smaller than that of the portion P3, for example, so that similarly to e.g., the portion P1 or P2 of the resin layer 12, the portion P6 remains on the silicon substrate 11 without being eliminated by the development process. As described above, portions irradiated with a sufficient amount of irradiation of (exposure to) the electron beam ER are eliminated, whereby a concave portion is formed in a portion in the formation region A0 indicated by a one-dot chain line in FIG. 7, and a concave/convex pattern, not shown, corresponding to the data track pattern Pt or the servo pattern Ps is formed on the silicon substrate 11.

Subsequently, a conductive layer is formed on a surface in which the concave/convex pattern is formed, whereafter an electroforming process is carried out. In the electroforming process, the concave/convex pattern formed on the silicon substrate 11 (resin layer 12) by the development process is transferred to a metal material to thereby form a convex portion having approximately the same shape in plan view as that of the formation region A0 (an example of a predetermined procedure in the present invention). This completes the formation of the stamper 20, as shown in FIG. 3. It should be noted that the method of manufacturing the stamper 20 using the substrate 10 on which the development process has been completed is not limited to the above example, but various types of known manufacturing methods may be employed. More specifically, for example, a method can be employed in which the silicon substrate 11 is etched using the resin layer 12 in which the concave/convex pattern is formed as a mask to thereby form the concave/convex pattern on the silicon substrate 11, and then the concave/convex pattern is transferred to the metal material. Further, it is possible to transfer the stamper 20 manufactured by the above methods to a stamper-forming member to thereby manufacture a stamper which has a concave/convex pattern where the concave-convex positional relationship is inverted relative to the concave/convex pattern 25 of the stamper 20. Furthermore, if the stamper having the concave/convex pattern where the concave-convex positional relationship is inverted is used to transfer the concave/convex pattern to still another stamper-forming member, it is also possible to manufacture a stamper having a concave/convex pattern where the concave/convex positional relationship conforms to the concave/convex pattern 25 of the stamper 20 in the concave-convex positional relationship.

In this case, in the drawing apparatus 1, as described hereinbefore, irradiation of the electron beam EB is stopped between the belt-shaped irradiation areas A1a and A1b (between the stop position A1a and the start position S1b), to thereby reduce the amount of exposure of the portion P6 to the electron beam EB. Therefore, on the inner periphery side and the outer periphery side of a rectangular region (the formation region A0 in FIG. 6) corresponding e.g., to the unit burst region of the burst pattern, the amount of irradiation (exposure) of the electron beam EB onto the resin layer 12 at the portions P2, P2, and P6 (see FIG. 7) are reduced, so that those portions of the resin layer 12 remain on the silicon substrate 11 without being eliminated by the development process. As a result, as indicated by a one-dot chain line in FIG. 7, opposite ends of the formation region A0 corresponding to the unit burst region, on the inner periphery side (left side as viewed in FIG. 7) and the outer periphery side (right side as viewed in FIG. 7) thereof are not rounded but substantially linearly formed.

Further, in a resin layer on which a drawing process has been carried out e.g., under the following drawing conditions according to the drawing method of the present invention, it is possible to avoid an excessive increase in an average value of maximum widths in the radial direction of a plurality of rectangular formation regions A0 corresponding to unit burst regions due to rounding of opposite ends of each formation region A0 on the inner periphery side and the outer periphery side thereof. Specifically, first, the resin layer was formed by spin coating ZEP520A (made by ZEON Corporation of Japan) such that it has a thickness of 100 nm after being subjected to baking treatment. Then, the baking treatment was performed thereon for five minutes at 180° C. Further, in a state in which the number (N in the present invention) of belt-shaped irradiation areas for one belt-shaped exposure area was set to 2, and the rotational speed of the turntable 3 was set to a linear velocity of 120 mm/sec, the length of each belt-shaped irradiation area on the resin layer (distance between the center of the electron beam EB at the start of irradiation thereof and the center of the electron beam EB at the stop of irradiation thereof, on the resin layer) was set to 20 nm, and the distance by which the belt-shaped irradiation areas were spaced from each other on the resin layer (distance between the center of the electron beam EB at the stop of irradiation thereof onto one belt-shaped irradiation area and the center of the electron beam EB at the start of irradiation thereof onto the other belt-shaped irradiation, on the resin layer) was set to 15 nm. In this case, the value of a beam current of the electron beam EB was set to 10 nA, and a planar pattern was drawn such that the distance between the centers in the radial direction of belt-shaped irradiation areas adjacent to each other within one formation region A0 becomes equal to 45 nm. In the planar pattern drawn under the above conditions (of the pattern drawing method according to the present invention), an average value of maximum widths of the rectangular regions in the direction of the radius of the substrate (the left-right direction as viewed in FIG. 7) was 120 nm.

Figure 12:
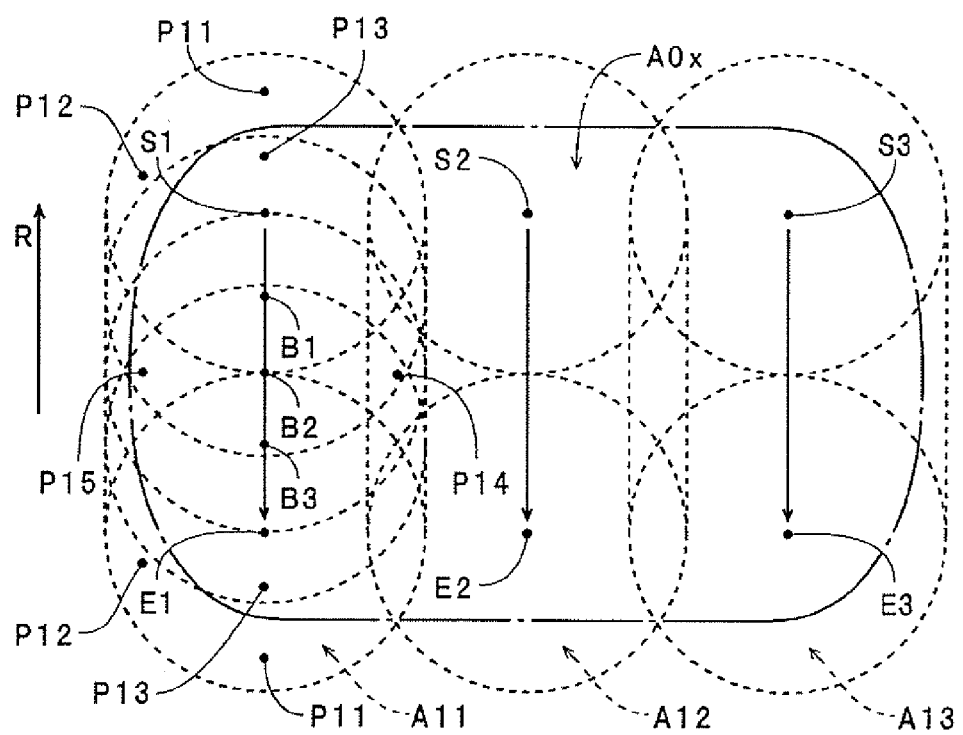
FIG. 12 is a diagram useful in explaining a conventional procedure for irradiating the electron beam onto the formation region.

In contrast, in a resin layer subjected to a drawing process according to the same procedure as employed in the drawing process by the conventional method of manufacturing a master carrier, an average value of maximum widths in the radial direction of a plurality of rectangular formation regions A0x corresponding to unit burst regions is larger than the average value of the maximum widths of the formation regions A0 due to rounding of opposite ends of each formation region A0x on the inner periphery side and the outer periphery side thereof. In this case, the length of each belt-shaped exposure area on the resin layer (distance between the center of the electron beam EB at the start of irradiation thereof and the center of the electron beam EB at the stop of irradiation thereof, on the resin layer) was set to 55 nm as a drawing condition. Further, the other conditions were set to the same conditions as the above-described drawing conditions. In a planar pattern drawn under such conditions (conventional pattern drawing method), the average value of maximum widths of the rectangular regions in the radial direction of the substrate (the left-right direction as viewed in FIG. 12) was 132 nm. Therefore, it can be understood that if a pattern is drawn by the pattern drawing method according to the present invention, opposite ends of each rectangular region (formation region A0) on the inner periphery side and the outer periphery side thereof are substantially linearly formed without protruding toward the inner periphery side and the outer periphery side.

On the other hand, when the magnetic disk 30 is manufactured using the stamper 20 manufactured according to the above manufacturing method, first, for example, the concave/convex pattern 25 of the stamper 20 is pressed against a resin mask layer of a preform, not shown, for manufacturing the magnetic disk 30, whereby the concave/convex pattern 25 is transferred to the resin mask layer of the preform (execution of an imprinting method). In this case, the preform is comprised e.g., of the soft magnetic layer 32, the intermediate layer 33, and the magnetic layer 34, which are sequentially formed on the substrate 31 in the mentioned order, and a metal mask layer and a resin mask layer are sequentially formed in the mentioned order on the magnetic layer 34 in a manner so as to cover the magnetic layer 34. Then, after the stamper 20 is removed from the preform, the metal mask layer is etched using the concave/convex pattern transferred to the resin mask layer as a mask. Thus, a concave/convex pattern, which has the same shape in plan view as that of the concave/convex pattern transferred to the resin mask layer, and whose concave-convex positional relationship conforms to the concave/convex pattern transferred to the resin mask layer, is formed on the metal mask layer. Subsequently, the magnetic layer 34 is etched using the concave/convex pattern transferred to the metal mask layer as a mask. By doing so, as shown in FIGS. 4 and 5, the concave/convex pattern 35, which has the same shape in plan view as that of the concave/convex pattern formed on the metal mask layer, and whose concave-convex positional relationship conforms to the concave/convex pattern formed on the metal mask layer, is formed on the magnetic layer 34, which completes the magnetic disk 30. It should be noted that the method of manufacturing the magnetic disk 30 using the stamper 20 is not limited to the above-described example, but the magnetic disk 30 can be manufactured by various types of known manufacturing methods.

As described hereinabove, in the pattern drawing method using the drawing apparatus 1, the electron beam En is intermittently irradiated N times (twice in the illustrated example) onto the belt-shaped exposure areas A1 to AK extending in the direction of rotation of the substrate 10 from one end to the other end of each belt-shaped exposure area in the direction of rotation of the substrate 10, the belt-shaped exposure area being defined within the formation region A0, to thereby irradiate the electron beam EB onto N (2 in the illustrated example) belt-shaped irradiation areas A1a and A1b extending in the direction of rotation of the substrate 10. More specifically, in the pattern drawing method using the drawing apparatus 1, the electron beam EB is intermittently irradiated N times (twice in the illustrated example) onto at least the respective belt-shaped exposure areas A1 and AK on the innermost periphery side and on the outermost periphery side, from the one end to the other end of each of the belt-shaped exposure areas A1 and AK in the direction of rotation, the one formation region A0 comprising the plurality of belt-shaped exposure areas A1 to AK.

Therefore, according to the pattern drawing method using the drawing apparatus 1, it is possible to avoid an excessive amount of the electron beam EB being irradiated to the periphery of an intermediate portion e.g., of the belt-shaped exposure area A1 in the direction of rotation (avoid excessive exposure of the resin layer 12). As a result, the respective opposite ends of the formation region A0 on the inner periphery side and the outer periphery side thereof can be substantially linearly formed, and therefore by drawing each unit burst region (rectangular region) forming a burst pattern according to the drawing method, it is possible to form a concave/convex pattern that makes it possible to form a burst pattern enabling detection of the position of a magnetic head with high accuracy. As a result, by using the concave/convex pattern, it is possible to manufacture the magnetic disk 30 in which a burst pattern enabling detection of the position of a magnetic head with high accuracy can be formed, and the stamper 20 for manufacturing the magnetic disk 30. In this case, even when one formation region A0 comprises a plurality of belt-shaped exposure areas A1, A2 . . . , by intermittently irradiating the electron beam EB N times (twice in the illustrated example) onto at least the belt-shaped exposure area A1 on the innermost periphery side of the formation region A0 and the belt-shaped exposure area AK on the outermost periphery side thereof, it is possible to substantially linearly form the opposite ends of the formation region A0 on the inner periphery side and the outer periphery side thereof.

Further, according to the pattern drawing method using the drawing apparatus 1, at least one (all the belt-shaped exposure areas A2 to A(K−1) in the illustrated example) of the belt-shaped exposure areas (the belt-shaped exposure areas A2 to A(K−1) in the illustrated example) except for the respective belt-shaped exposure areas A1 and AK on the innermost periphery side and the outermost periphery side of the formation region A0 is continuously irradiated with the electron beam EB from one end to the other end in the direction of rotation of the substrate. Accordingly, compared with a drawing method in which all the belt-shaped exposure areas A1 to AK from the innermost periphery side to the outermost periphery side of the formation region A0 are exposed to the electron beam EB through intermittent irradiation thereof, it is possible to reduce the number of times of control of the start and stop of the irradiation of the electron beam EB by the number of the belt-shaped exposure areas (belt-shaped exposure areas A2 to A(K−1) in the illustrated example) continuously irradiated from one ends to the other ends thereof in the direction of rotation. This makes it possible to reduce the amount of information on the start positions S and the stop positions E in the drawing procedure data DP. Therefore, it is possible to easily draw a pattern which has the formation region A0 with opposite ends on the inner periphery side and the outer periphery side thereof being substantially linear, while avoiding control of the beam generating section 4, the blanking control section 5, and the beam deflecting section 7 by the control section 8 being made complicated.

Further, according to the above-described method of manufacturing the stamper 20, the planar pattern of the data track pattern Pt and the servo pattern Ps is drawn on the resin layer 12 according to the pattern drawing method using the drawing apparatus 1; the resin layer 12 having the planar patterns drawn thereon is subjected to development process to form a concave/convex pattern on the silicon substrate 11; the formed concave/convex pattern is transferred to a stamper-forming member (metal material) according to a predetermined procedure; and the stamper 20 for use in manufacturing the magnetic disk 30 is manufactured. This makes it possible to easily manufacture the magnetic disk 30 having the concave/convex pattern 35 including rectangular regions (convex portions having a rectangular shape in plan view, or concave portions having a rectangular shape in plan view), such as the unit burst regions of the burst pattern, each of which has opposite ends on the inner periphery side and the outer periphery side thereof substantially linearly formed.

It should be noted that the present invention is by no means limited to the above-described configuration and method, For example, although the description has been given of the example in which one formation region A0 is exposed to the electron beam EB by dividing the formation area A0 into a plurality of belt-shaped exposure areas A1 to AK for divisional exposure, this is not limitative, but when the formation region A0 has a long shape in the direction of rotation of the substrate 10, it is also possible to irradiate the electron beam EB in a state in which it is adjusted by the beam shaping section 6 such that the electron beam EB to be irradiated onto the resin layer 12 has an effective drawing diameter equal to the width of the formation region A0 in the radial direction, whereby the whole area of one formation region A0 can be exposed to the electron beam EB by exposure of one belt-shaped exposure area A1. Further, although in the pattern drawing method using the drawing apparatus 1, the whole area of the belt-shaped exposure area A1 is exposed to the electron beam EB by irradiation of the electron beam EB onto the belt-shaped irradiation areas A1$a$ and A1$b$, by way of example, this is not limitative. For example, it is also possible to draw a planar pattern such that the whole area of the belt-shaped exposure area A1 is exposed to the electron beam EB by irradiation onto the belt-shaped exposure area A2, in a state in which the amount of exposure of the electron beam EB onto a portion of the belt-shaped exposure area A1 on the side of the belt-shaped exposure area A2 is insufficient when irradiation onto the belt-shaped irradiation areas A1$a$ and A1$b$ has been completed. When this drawing method is employed as well, similarly to the case of planar patterns being drawn by the pattern drawing method using the drawing apparatus 1, the respective opposite ends of the formation region A0 on the inner periphery side and the outer periphery side thereof can be substantially linearly formed.

Figure 8:
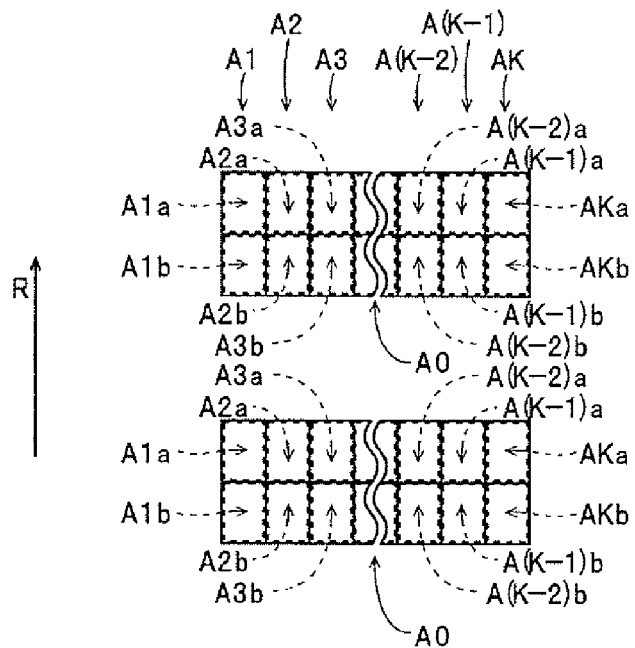
FIG. 8 is a diagram useful in explaining another procedure for drawing the burst pattern or the like on the substrate.

Furthermore, although in the pattern drawing method using the drawing apparatus 1, out of the belt-shaped exposure areas A1 to AK in the formation region A0, only the belt-shaped exposure area A1 on the innermost periphery side of the formation region A0 and the belt-shaped exposure area AK on the outermost periphery side thereof are intermittently irradiated with the electron beam EB, it is also possible to employ a drawing method for performing a drawing process in which, as shown in FIG. 8, the electron beam EB is intermittently irradiated onto all the belt-shaped exposure areas A1 to AK, whereby the electron beam ESB is sequentially irradiated onto two belt-shaped irradiation areas A1$a$ and A1$b$, two belt-shaped irradiation areas A2$a$ and A2$b$, two belt-shaped irradiation areas AK$a$ and AK$b$ of the respective belt-shaped exposure areas A1 to AK. It should be noted that in FIG. 8, and FIGS. 9 and 10 referred to hereinafter, elements identical to those of the above-described drawing method are designated by identical reference numerals and duplicate description thereof will be omitted.

Figure 9:
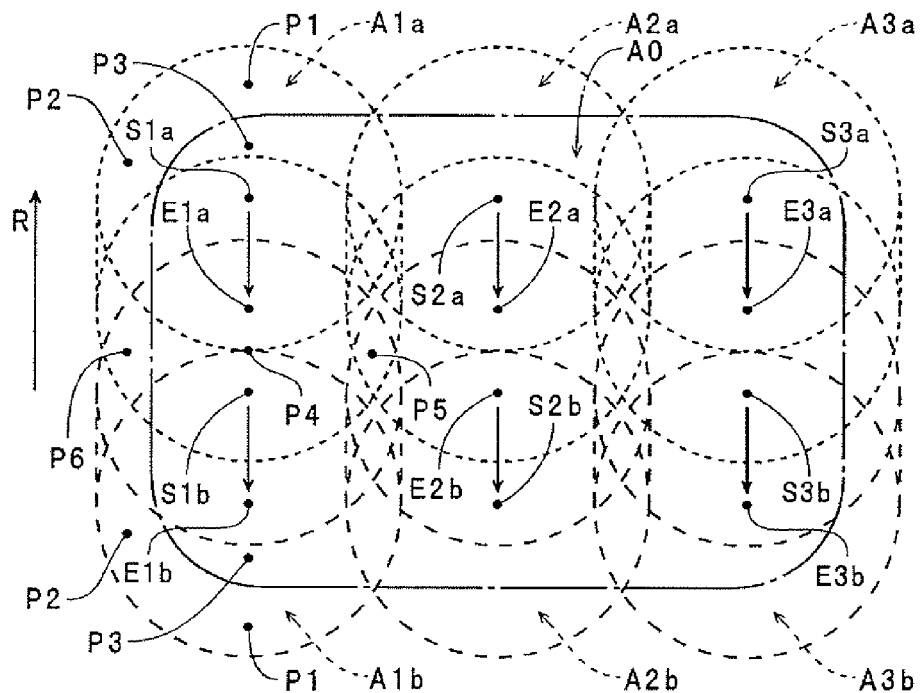
FIG. 9 is a diagram useful in explaining another procedure for irradiating the electron beam onto the formation region.

According to this drawing method, as shown in FIG. 9, when irradiation of the electron beam En e.g., onto the belt-shaped exposure area A1, which is located on the innermost periphery side of the formation region A0 of all the belt-shaped exposure areas A1 to AK, is stopped between the belt-shaped irradiation areas A1$a$ and A1$b$, the amount of exposure of the portion P6 to the electron beam EB is reduced. Therefore, similarly to the aforementioned pattern drawing method in which the electron beam EB is intermittently irradiated onto only the belt-shaped exposure area A1 on the inner periphery side and the belt-shaped exposure area AK on the outer periphery side, the amounts of irradiation of the electron beam ESB onto (the amounts of exposure to the electron beam EB) e.g., the portions P2, P2, and P6 of the resin layer 12 are reduced, respectively, on the inner periphery side and the outer periphery side of the rectangular region (the formation region A0 in FIG. 8) corresponding to the unit burst region of the burst pattern, so that the resin layer 12 at the portions remains on the silicon substrate 11 without being eliminated from the silicon substrate 11 by the development process. As a result, as indicated by a one-dot chain line in FIG. 9, opposite ends of the formation region A0 corresponding to the unit burst region, on the inner periphery side and the outer periphery side thereof can be substantially linearly formed.

Figure 10:
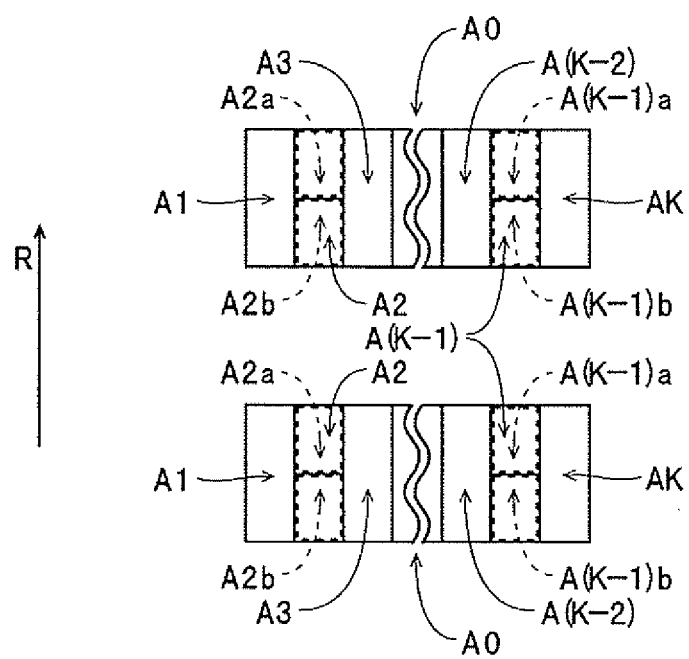
FIG. 10 is a diagram useful in explaining still another procedure for drawing the burst pattern on the substrate.

Further, the areas subjected to intermittent irradiation of the electron beam EB is not limited to the belt-shaped exposure areas on the innermost periphery side and the outermost periphery side of the formation region A0. For example, as shown in FIG. 10, it is also possible to employ a drawing method in which the electron beam ES is intermittently irradiated in a manner such that the electron beam ES is sequentially irradiated onto the two belt-shaped irradiation areas A2$a$ and A2$b$ within the belt-shaped exposure area A2, which is a second innermost belt-shaped exposure area of all the belt-shaped exposure areas A1 to AK in the formation region A0, and two belt-shaped irradiation areas A(K−1)$a$ and A(K−1)$b$ of a belt-shaped exposure area A(K−1), which is a second outermost belt-shaped exposure area of all the belt-shaped exposure areas A1 to AK. According to this pattern drawing method, it is possible to sufficiently reduce the degree of roundness of the opposite ends of the formation region A0 corresponding to the unit burst region, on the inner periphery side and the outer periphery side thereof.

Further, although in the pattern drawing method using the drawing apparatus 1, when the electron beam EB is irradiated onto the belt-shaped irradiation areas A1a and A1b within the belt-shaped exposure area A1, the irradiation onto the belt-shaped irradiation area A1b starts immediately after completion of the irradiation onto the belt-shaped irradiation area A1a, the procedure of irradiation onto belt-shaped irradiation areas within the same belt-shaped exposure area is not limited to the above. More specifically, e.g., to sequentially irradiate the electron beam onto the two belt-shaped irradiation areas A1a and A1b within the belt-shaped exposure area A1, by executing irradiation of the electron beam En onto the belt-shaped irradiation area A1a during a first rotation of the substrate 10 (an example of an M-th rotation in the present invention), and then executing the irradiation of the electron beam EB onto the belt-shaped irradiation area A1b during a second rotation of the substrate 10 (an example of an L-th rotation in the present invention), it is consequently possible to employ a drawing method in which the electron beam EB is intermittently irradiated onto the belt-shaped exposure area A1 during two rotations of the substrate 10. In this drawing method, as shown in FIG. 6, when the formation regions A0 to be irradiated with the electron beam EB exist along the direction of rotation of the substrate 10, a state in which the electron beam EB ceases to be irradiated can be maintained only during a time period (time period corresponding to the distance W shown in FIG. 6) from time that the irradiation of the electron beam EB onto the belt-shaped irradiation area A1a within the belt-shaped exposure area A1 of one formation region A0 is completed to time that the electron beam EB starts to be irradiated onto a belt-shaped irradiation area A1a within a belt-shaped exposure area A1 of a formation region A0 adjacent to the one formation region A0 in the rotation of the substrate 10.

As described above, for example, by irradiating the electron beam EB onto one belt-shaped irradiation area A1a out of the belt-shaped irradiation areas A1a and A1b, which are adjacent to each other in the direction of rotation of the substrate 10 within the belt-shaped exposure area A1, during the M-th rotation of the substrate 10, whereafter the electron beam ER is irradiated onto the other belt-shaped irradiation area A1b during the L-th rotation of the substrate 10 (second rotation in the illustrated example), there is given a certain time period from time that the electron beam EB ceases to be irradiated onto one belt-shaped irradiation area (e.g., the belt-shaped irradiation area A1a) to time that the electron beam EB starts to be irradiated onto the other belt-shaped irradiation area (the belt-shaped irradiation area A1a within the formation region A0 adjacent to the one formation region A0 in the rotation of the substrate 10). Therefore, even if the rotational speed of the substrate 10 rotated by the turntable 3 is sufficiently increased, it is possible to execute irradiation of the electron beam EB and stop of the irradiation of the beam onto the respective belt-shaped irradiation areas at an accurate timing. This makes it possible to sufficiently shorten a time period required for a drawing process per one substrate 10. Further, also when a drawing apparatus 1 incorporating an inexpensive blanking control section 5 with low processing capability is used, it is possible to irradiate the electron beam ES at an accurate timing without largely decreasing the rotational speed of the substrate 10.

Further, although in the above-described example, the irradiation of the electron beam ER is stopped at the central portion of e.g., the belt-shaped exposure area A1 in the direction of rotation to thereby divide the belt-shaped exposure area A1 into two at the central portion in the direction of rotation for exposure of the electron beam EB, the position for stopping the irradiation of the drawing beam in the present invention is not limited to the central portions of the belt-shaped exposure areas A1 and AK in the direction of rotation. For example, it is possible to set the position for stopping the irradiation of the electron beam EB at a desired position closer to one end or the other end of each of the belt-shaped exposure areas A1 and AK in the direction of rotation of the substrate 10. Even when the drawing method is configured such that the position for stopping the irradiation of the drawing beam is set to a portion other than the central portion of each belt-shaped exposure area as described above, unlike the conventional drawing method which continuously irradiates the drawing beam from the one end to the other end of each of the belt-shaped exposure areas A1 and AK in the direction of rotation, it is possible to avoid the opposite ends of the formation region A0 on the inner periphery side and the outer periphery side thereof being rounded.

Figure 11:
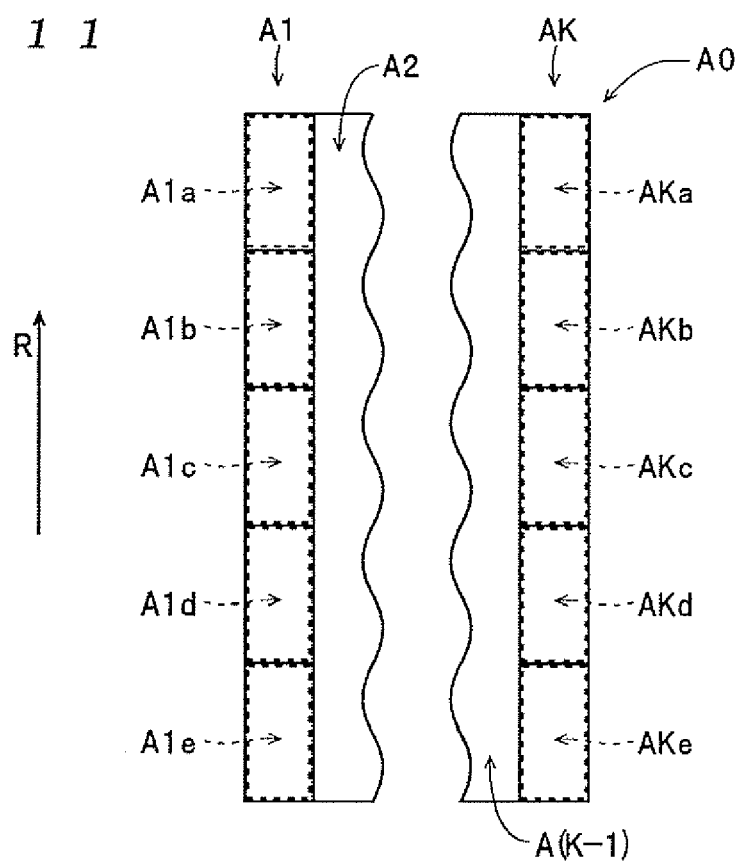
FIG. 11 is a diagram useful in explaining a procedure for irradiating the electron beam onto another formation region.

Furthermore, although in the above-described example, the pattern is drawn by sequentially irradiating the electron beam EB onto two belt-shaped irradiation areas to thereby expose the whole area of one belt-shaped exposure area to the electron beam EB, the number of N in the present invention is not limited to 2, but it is possible to draw a pattern by sequentially irradiating the electron beam EB onto three or more belt-shaped irradiation areas (intermittently irradiating the electron beam EB three or more times from one end to the other end of one belt-shaped exposure area in the direction of rotation) to thereby expose the whole area of one belt-shaped exposure area to the electron beam EB. More specifically, for example, as shown in FIG. 11, it is possible to irradiate the electron beam EB onto five belt-shaped irradiation areas A1a to A1e (belt-shaped irradiation areas AKa to Ake, each of whose length is equal, as one example) in the direction of the substrate 10 by intermittently irradiating the electron beam ER five times (an example in which N in the present invention is 5) from one end (upper end as viewed in FIG. 11) of a belt-shaped exposure area A1 (belt-shaped exposure area AK) in the direction of rotation of the substrate 10 (direction indicated by an arrow R in FIG. 11) to the other end thereof (lower end as viewed in FIG. 11).

In this case, when the electron beam EB is irradiated onto the five belt-shaped irradiation areas A1a to A1e during a plurality of rotations of the substrate 10 such that the whole area of the belt-shaped exposure area A1 is exposed to the electron beam EB, the number of belt-shaped irradiation areas to be irradiated with the electron beam EB during one rotation of the substrate 10, and the order of irradiation of the electron beam EB onto the belt-shaped irradiation areas are not particularly limited. More specifically, for example, after executing irradiation of the electron beam EB onto the belt-shaped irradiation areas A1a, A1c, and A1e during the first rotation of the substrate 10 (an example of the M-th rotation in the present invention), by executing irradiation of the electron beam SB onto the belt-shaped irradiation areas A1b and A1d during the second rotation of the substrate 10 (an example of the L-th rotation in the present invention), it is consequently possible to employ a drawing method in which the electron beam ESB is intermittently irradiated onto the belt-shaped exposure area A1 during two rotations of the substrate 10.

Further, by irradiating the electron beam EB onto the belt-shaped irradiation areas A1b and A1e during the second rotation of the substrate 10 after irradiating the electron beam EB onto the belt-shaped irradiation areas A1a and A1d during the first rotation of the substrate 10, and then irradiating the electron beam EB onto only the belt-shaped irradiation area A1c during the third rotation of the substrate 10, it is consequently possible to employ a drawing method in which the electron beam ESB is intermittently irradiated onto the belt-shaped exposure area A1 during three rotations of the substrate 10. Moreover, for example, by irradiating the electron beam ESB onto the belt-shaped irradiation area A1a during the first rotation of the substrate 10, irradiating the electron beam ESB onto the belt-shaped irradiation area A1c during the second rotation of the substrate 10, irradiating the electron beam EB onto the belt-shaped irradiation area A1e during the third rotation of the substrate 10, irradiating the electron beam EB onto the belt-shaped irradiation area A1b during the fourth rotation of the substrate 10, and irradiating the electron beam EB onto the belt-shaped irradiation area A1d during the fifth rotation of the substrate 10, it is also consequently possible to employ a drawing method in which the electron beam EB is intermittently irradiated onto the belt-shaped exposure area A1 during five rotations of the substrate 10. Even when the electron beam EB is irradiated according to any one of the above procedures, unlike the conventional drawing method which continuously irradiates the drawing beam from the one end to the other end of each of the belt-shaped exposure areas A1 and AK in the direction of rotation of the substrate 10, it is possible to sufficiently avoid the opposite ends of the formation region A0 on the inner periphery side and the outer periphery side thereof being rounded.

Further, the drawing beam in the present invention is not limited to the above-described electron beam EB, but it is possible to employ various types of charged particle beams, such as an ion beam. Furthermore, the use of a concave/convex pattern formed by using a pattern drawn according to the pattern drawing method of the present invention is not limited to manufacturing of information recording media, such as the magnetic disk 30 (stamper 20), but in forming a concave/convex pattern for use in manufacturing semiconductor devices, for example, it is also possible to employ the pattern drawing method according to the present invention to draw patterns. This makes it possible to avoid rectangular portions constituting e.g., a semiconductor device being rounded. Further, the information recording media manufactured by using a pattern drawn according to the pattern drawing method of the present invention are not limited to discrete track-type magnetic disks, such as the magnetic disk 30, but also include magnetic disks in which a data track pattern is magnetically written in a continuous magnetic layer and a servo pattern comprises the concave/convex pattern 35. Further, they include not only magnetic disks based on the perpendicular recording method, such as the magnetic disk 30, but also magnetic disks based on a longitudinal recording method. Moreover, the drawing method according to the present invention can be suitably applied to manufacturing of not only magnetic disks but also optical discs (optical recording media).

What is claimed is:

1. A pattern drawing method of drawing a planar pattern of one of convex or concave portions forming a concave/convex pattern on a resin layer while rotating a substrate on whose surface the resin layer is formed, the method comprising:

intermittently irradiating a drawing beam N times (N is a natural number equal to or more than 2) onto a generally belt-shaped exposure area extending in a direction of rotation of the substrate from one end to the other end of the belt-shaped exposure area in the direction of rotation of the substrate, the belt-shaped exposure area being defined within a formation region, in which one of the convex or concave portions is to be formed, thereby irradiating the drawing beam onto N generally belt-shaped irradiation areas extending in the direction of rotation of the substrate.

2. A pattern drawing method according to claim 1, the method comprising:

intermittently irradiating the drawing beam N times onto respective generally belt-shaped exposure areas at least on an innermost periphery side and on an outermost periphery side of the formation region, from the one end to the other end of each of the belt-shaped exposure areas, the one formation region comprising a plurality of the belt-shaped exposure areas located at different distances from a center of the substrate.

3. A pattern drawing method according to claim 2, the method comprising:

continuously irradiating the drawing beam onto at least one of the belt-shaped exposure areas except for the respective belt-shaped exposure areas on the innermost periphery side and the outermost periphery side of the formation region, from the one end to the other end of the at least one of the belt-shaped exposure areas.

4. A pattern drawing method according to claim 1, the method comprising:

irradiating the drawing beam onto one of the belt-shaped irradiation areas adjacent to each other in the direction of rotation of the substrate in one of the belt-shaped exposure areas during M-th (M is a natural number) rotation of the substrate; and irradiating the drawing beam onto the other of the belt-shaped irradiation areas adjacent to each other during L-th (L is a natural number equal to or more than (M+1)) rotation of the substrate.

5. A method of manufacturing a stamper, the method comprising:

forming the concave/convex pattern by performing a development process on the resin layer having the planar pattern drawn thereon according to the pattern drawing method as claimed in claim 1; and transferring the concave/convex pattern to a stamper-forming member according to a predetermined procedure.

6. A pattern drawing apparatus configured to draw a planar pattern of one of convex or concave portions forming a concave/convex pattern on a resin layer while rotating a substrate on whose surface the resin layer is formed, the pattern drawing apparatus comprising a rotating mechanism configured to rotate the substrate on whose surface the resin layer is formed, a beam irradiating section configured to irradiate a drawing beam, and a control section configured to control rotation of the substrate rotated by the rotating mechanism and to control start and stop of irradiation of the drawing beam irradiated by the beam irradiating section, wherein the control section controls the beam irradiating section to intermittently irradiate the drawing beam N times (N is a natural number equal to or more than 2) onto a generally belt-shaped exposure area extending in a direction of rotation of the substrate from one end to the other end of the belt-shaped exposure area in the direction of rotation of the substrate, the belt-shaped exposure area being defined within a formation region, in which one of the convex or concave portions is to be formed, to thereby irradiate the drawing beam onto N generally belt-shaped irradiation areas extending in the direction of rotation of the substrate.

* * * * *